(12) United States Patent
Lee

(10) Patent No.: US 10,622,040 B2
(45) Date of Patent: *Apr. 14, 2020

(54) THREE-DIMENSIONAL SEMICONDUCTOR DEVICE WITH TOP DUMMY CELLS AND BOTTOM DUMMY CELLS AND OPERATING METHOD THEREOF

(71) Applicant: SK hynix Inc., Icheon-si Gyeonggi-do (KR)

(72) Inventor: Hee Youl Lee, Icheon-si (KR)

(73) Assignee: SK hynix Inc., Icheon-si Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/224,305

(22) Filed: Dec. 18, 2018

(65) Prior Publication Data

US 2019/0122711 A1     Apr. 25, 2019

Related U.S. Application Data

(60) Continuation of application No. 15/668,102, filed on Aug. 3, 2017, now Pat. No. 10,192,597, which is a division of application No. 14/692,123, filed on Apr. 21, 2015, now Pat. No. 9,754,647.

(30) Foreign Application Priority Data

Nov. 17, 2014   (KR) .................. 10-2014-0160128

(51) Int. Cl.
| | |
|---|---|
| *G11C 7/14* | (2006.01) |
| *G11C 16/04* | (2006.01) |
| *G11C 16/16* | (2006.01) |
| *G11C 16/12* | (2006.01) |

(Continued)

(52) U.S. Cl.
CPC ............ *G11C 7/14* (2013.01); *G11C 16/0483* (2013.01); *G11C 16/12* (2013.01); *G11C 16/14* (2013.01); *G11C 16/16* (2013.01); *G11C 16/28* (2013.01)

(58) Field of Classification Search
CPC ....... G11C 7/14; G11C 16/12; G11C 16/0483; G11C 16/16; G11C 16/28
See application file for complete search history.

(56) References Cited

U.S. PATENT DOCUMENTS

| | | |
|---|---|---|
| 7,266,019 B2 | 9/2007 | Taoka et al. |
| 7,869,280 B2 | 1/2011 | Kosaki et al. |
| 7,894,268 B2 | 2/2011 | Hosono |

(Continued)

FOREIGN PATENT DOCUMENTS

| | | |
|---|---|---|
| KR | 1020120019689 A | 3/2012 |
| KR | 1020120130939 A | 12/2012 |
| KR | 1020120134941 A | 12/2012 |

*Primary Examiner* — David Lam
(74) *Attorney, Agent, or Firm* — William Park & Associates Ltd.

(57) ABSTRACT

Provided is a semiconductor device and an operating method thereof. The operating method of the semiconductor device includes performing a soft program operation on a top dummy cell and a bottom dummy cell, among dummy cells stacked in a vertical direction, by applying a first soft program voltage to a bottom dummy word line coupled to the bottom dummy cell and a second soft program voltage greater than the first soft program voltage to a top dummy word line coupled to the top dummy cell formed above the bottom dummy cell.

12 Claims, 7 Drawing Sheets

(51) Int. Cl.
*G11C 16/14* (2006.01)
*G11C 16/28* (2006.01)

(56) References Cited

U.S. PATENT DOCUMENTS

| | | | |
|---|---|---|---|
| 7,974,130 B2 | 7/2011 | Nakamura et al. | |
| 8,023,330 B2 | 9/2011 | Kim et al. | |
| 8,432,733 B2* | 4/2013 | Higashitani | G11C 11/5628 |
| | | | 365/185.02 |
| 9,013,923 B2 | 4/2015 | Park | |
| 9,214,237 B2* | 12/2015 | Shiino | G11C 11/5635 |
| 9,305,654 B2 | 4/2016 | Parat et al. | |
| 10,192,597 B2* | 1/2019 | Lee | G11C 7/14 |
| 2010/0046293 A1* | 2/2010 | Won | G11C 16/3418 |
| | | | 365/185.11 |
| 2014/0264537 A1 | 9/2014 | Sakamoto et al. | |
| 2015/0146487 A1 | 5/2015 | Jung | |
| 2015/0332783 A1 | 11/2015 | Jeong | |

\* cited by examiner

|  | SOC PROGRAM | SOC VERIFY |
|---|---|---|
| BL | 0V | POSITIVE VOLTAGE |
| SL | Vdd | 0V |
| DSL | Vdd | VON |
| SSL | 0V | VON |
| DWL_up | Vpgm_soc+Va | Vf_soc+Vb |
| WL | FLOATING/0V/POSITIVE VOLTAGE | FLOATING/0V/POSITIVE VOLTAGE |
| DWL_down | Vpgm_soc | Vf_soc | ically to a soft program operation of a three-dimensional semiconductor device.

THREE-DIMENSIONAL SEMICONDUCTOR DEVICE WITH TOP DUMMY CELLS AND BOTTOM DUMMY CELLS AND OPERATING METHOD THEREOF

CROSS-REFERENCE TO RELATED APPLICATION

The present application is a continuation application of U.S. application Ser. No. 15/668,102, filed on Aug. 3, 2017, now U.S. Pat. No. 10,192,597, which is a divisional application of U.S. application Ser. No. 14/692,123, filed on Apr. 21, 2015, no U.S. Pat. No. 9,754,647, and claims priority to Korean patent application number 10-2014-0160128 filed on Nov. 17, 2014, in the Korean Intellectual Property Office, the entire disclosure of which is incorporated by reference herein.

BACKGROUND

1. Technical Field

Various embodiments relate generally to a semiconductor device and an operating method thereof and, more particularly, to a soft program operation of a three-dimensional semiconductor device.

2. Related Art

A three-dimensional device may include memory layers. The memory layers may be arranged in a vertical direction with respect to a semiconductor substrate. Word lines may be stacked along the memory layers and separated from each other. Memory cells may be formed at positions where the word lines and the memory layers make contact with each other.

Since the three-dimensional semiconductor device includes memory layers arranged in a vertical direction, a difference in thickness may occur between the top and bottom portions of the memory layers during a manufacturing process.

The differences in thickness of the memory layers may cause a difference in electric fields between the top and bottom portions of the memory layers. A time taken to perform a soft program operation subsequent to an erase operation may be increased due to these differences in electric fields. For example, a soft program operation may be performed on dummy cells of the three-dimensional semiconductor device. Since the dummy cells are formed on the top and bottom portions of the memory layers, respectively, the soft program operation may be separately performed thereon.

BRIEF SUMMARY

An operating method of a semiconductor device according to an embodiment may include performing a soft program operation on a top dummy cell and a bottom dummy cell, among dummy cells stacked in a vertical direction, by applying a first soft program voltage to a bottom dummy word line coupled to the bottom dummy cell and a second soft program voltage greater than the first soft program voltage to a top dummy word line coupled to the top dummy cell formed above the bottom dummy cell.

An operating method of a semiconductor device according to an embodiment may include performing an erase operation on a memory block including bottom dummy cells, a plurality of memory cells, top dummy cells and selection transistors arranged in a vertical direction with respect to a pipe gate. The operating method of the semiconductor device may include increasing threshold voltages of the bottom dummy cells and the top dummy cells at substantially the same time by applying a first soft program voltage to a bottom dummy word line coupled to the bottom dummy cells and a second soft program voltage greater than the first soft program voltage to the top dummy word line coupled to the top dummy cells. The operating method of the semiconductor device may include verifying the top and bottom dummy cells, and repeatedly performing the erase operation and increasing the threshold voltages of the top and bottom dummy cells at substantially the same time by gradually increasing the first and second soft program voltages until the verifying of the top and bottom dummy cells passes.

An operating method of a semiconductor device according to an embodiment may include performing an erase operation on a memory block including source selection transistors, bottom dummy cells, a plurality of memory cells, top dummy cells and drain selection transistors arranged in a vertical direction with respect to a substrate. The operating method of the semiconductor device may include increasing threshold voltages of the bottom dummy cells and the top dummy cells by increasing a first soft program voltage to a bottom dummy word line coupled to the bottom dummy cells and a second soft program voltage greater than the first soft program voltage to a top dummy word line coupled to the top dummy cells. The operating method of the semiconductor device may include verifying the top and bottom dummy cells, and repeatedly performing the erase operation and increasing the threshold voltages of the bottom dummy cells and the top dummy cells at the same time by gradually increasing the first and second soft program voltages until the verifying of the top and bottom dummy cells passes.

In an embodiment, a semiconductor device may include a memory block including dummy cells stacked in a vertical direction and memory cells stacked between the dummy cells. The semiconductor device may include a peripheral circuit configured for erasing the memory block and performing a soft program operation. The semiconductor device may include a control circuit configured for controlling the peripheral circuit to apply a first soft program voltage to bottom dummy word lines coupled to bottom dummy cells, among the dummy cells. The semiconductor device may include a second soft program voltage greater than the first soft program voltage to top dummy word lines coupled to top dummy cells during the soft program operation.

DETAILED DESCRIPTION

Hereinafter, various examples of embodiments will be described in detail with reference to the accompanying drawings. The figures are provided to allow those with ordinary skill in the art to understand the scope of the embodiments. The examples of embodiments may be embodied in different forms and should not be construed as limited to the embodiments set forth. Rather, these examples of the embodiments are provided so that this disclosure will be thorough and complete.

Various embodiments may relate to a semiconductor device capable of reducing a soft program operation time and an operating method thereof.

Figure 1:
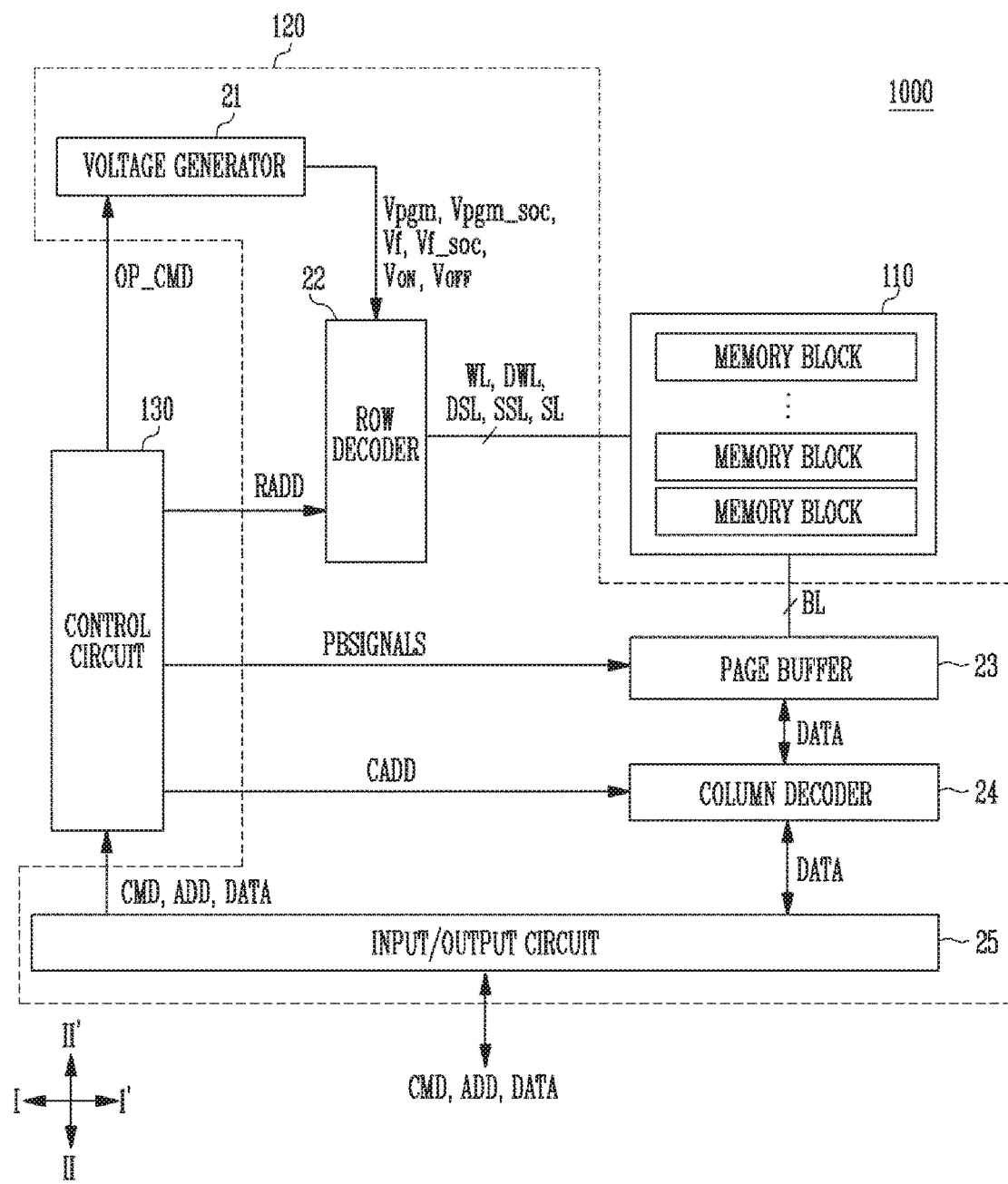
FIG. 1 is a diagram illustrating an example of a representation of a semiconductor device according to an embodiment.

FIG. 1 is a diagram illustrating an example of a representation of a semiconductor device according to an embodiment.

Referring to FIG. 1, a semiconductor device 1000 may include a memory cell array 110 configured for storing data. The semiconductor device 1000 may include a circuit group 120 configured to perform a program operation, a read operation or an erase operation on the memory cell array 110. The semiconductor device 1000 may include a control circuit 130 configured to perform with the circuit group 120.

The memory cell array 110 may include a plurality of memory blocks having substantially the same configuration. Each of the memory blocks may include a plurality of cell strings. Each of the cell strings may include a plurality of memory cells configured for storing data. The memory cells may include a three-dimensional structure whereby the memory cells are arranged in a vertical direction with respect to a substrate. The memory cells may include single level cells (SLC) storing one bit of data, multi level cells (MLC), triple level cells (TLC) or quadruple level cells (QLC) storing two or more bits of data. For example, two bits of data may be stored in each of the multi level cells (MLC), three bits of data may be stored in each of the triple level cells (TLC), and four bits of data may be stored in each of the quadruple level cells (QLC).

The circuit group 120 may include a voltage generator 21, a row decoder 22, and a page buffer 23. The circuit group 120 may include a column decoder 24 and an input/output circuit 25.

The voltage generator 21 may generate operating voltages having various levels in response to an operation command signal OP_CMD. For example, the voltage generator may generate a program voltage Vpgm, a soft program voltage Vpgm_soc, and a verify voltage Vf. For example, the voltage generator 21 may generate a soft verify voltage Vf_soc, a turn on voltage $V_{ON}$ and a turn-off voltage $V_{OFF}$. The soft program voltage Vpgm_soc and the soft verify voltage Vf_soc may be applied to perform a soft program (soft program on chip; SOC) operation subsequent to an erase operation. In addition, the voltage generator 21 may generate various voltages necessary to perform the program, erase and read operations.

The row decoder 22 may select one of the memory blocks included in the memory cell array 110 in response to a row address RADD and transfer the operating voltages to word lines WL, drain selection lines DSL, source selection lines SSL and a source line SL coupled to the selected memory block. When the dummy word lines DWL are coupled to the cell strings, the row decoder 22 may transfer the operating voltages to the dummy word lines DWL.

The page buffer 23 may be coupled to the memory blocks through bit lines BL. The page buffer 23 may exchange data with the selected memory block during program, read and erase operations and temporarily store the received data. The page buffer 23 may precharge the bit lines BL by applying a positive voltage to the bit lines BL during a soft program verify operation, and sense a voltage or current on the bit lines BL reflecting states of the dummy cells. When the bit lines BL are arranged in a first direction I-I', memory blocks sharing the bit lines BL may be arranged in a second direction II-II' perpendicular to the first direction I-I'.

The column decoder 24 may exchange data DATA with the page buffer 23 in response to the column address CADD.

The input/output circuit 25 may transfer a command signal CMD and an address ADD, which are externally transferred, to the control circuit 130. The input/output circuit 25 may transfer externally transferred data DATA to the column decoder 24, and output the data DATA from the column decoder 24 to an external device, or transfer the data DATA to the control circuit 130.

The control circuit 130 may control the circuit group 120 in response to the command signal CMD and the address ADD. The control circuit 130 may control the circuit group 120 to perform an erase operation on selected memory cells and perform a soft program operation on dummy cells included in the selected memory block. The soft program operation may refer to an operation of increasing threshold voltages of the erased dummy cells. The threshold voltages of the erased dummy cells may be increased within a range less than 0V. The control circuit 130 may control the circuit group 120 so that top dummy cells and bottom dummy cells may be soft-programmed at the same time during the soft program operation. For example, the control circuit 130 may control the circuit group 120 to apply a first soft program voltage to bottom dummy word lines coupled to the bottom dummy cells and a second soft program voltage higher than the first soft program voltage to top dummy word lines coupled to the top dummy cells during the soft program operation. The control circuit 130 may control the circuit group 120 to perform a verify operation on the top and bottom dummy cells after applying the first and second soft program voltages to the bottom and top dummy word lines, respectively. During a verify operation, the control circuit 130 may control the circuit group 120 to apply a first soft program verify voltage to the bottom dummy word line and a second soft program verify voltage higher than the first soft program verify voltage to the top dummy word line.

The above-described memory block is described below.

Figure 2:
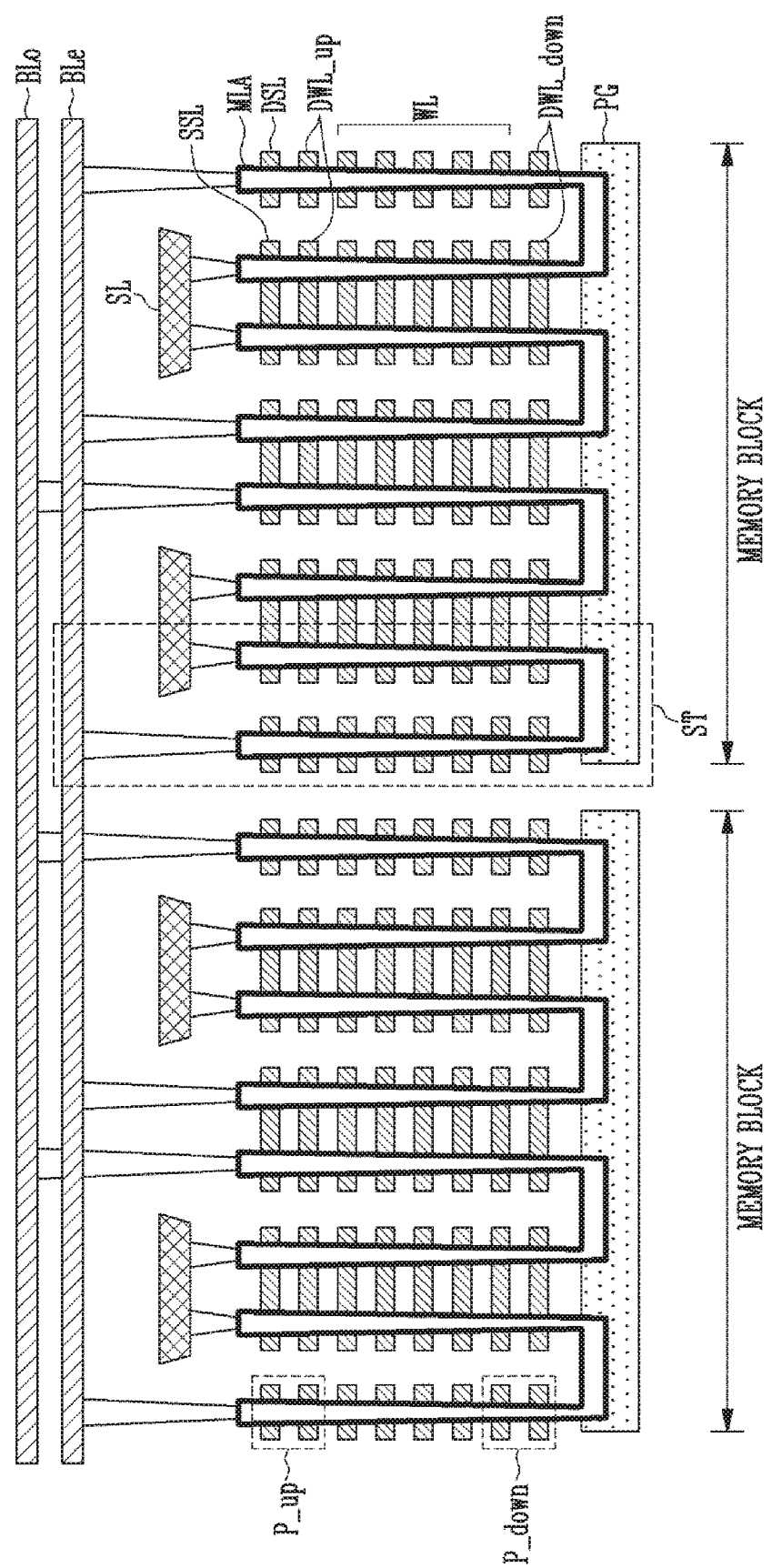
FIG. 2 is a cross-sectional diagram of an example of a representation of the memory blocks illustrated in FIG. 1.

FIG. 2 is a cross-sectional view illustrating an example of a representation of the memory blocks illustrated in FIG. 1.

Since the memory blocks have substantially the same configuration, examples of some of the memory blocks are described with reference to FIG. 2.

Each of the memory blocks may include a plurality of cell strings ST. The plurality of cell strings ST may be arranged in a vertical direction with respect to a semiconductor substrate. The cell strings ST adjacent to each other may have symmetrical shapes or substantially symmetrical shapes. As an example, one of the cell strings ST is described below.

The cell string ST may include a pipe gate PG formed over the substrate. The cell string ST may include memory layers MLA extending in a vertical direction with respect to the pipe gate PG. The cell string ST may include word lines WL stacked along the memory layers MLA and separated from each other. The cell string ST may include the drain selection lines DSL, and the source selection lines SSL. The dummy word lines DWL_up may be formed between the word lines WL and the drain selection line DSL, and between the word lines WL and the source selection line SSL. The dummy word lines DWL_down may be formed between the word lines WL and the pipe gate PG. Memory cells may be formed at positions where the word lines WL and the memory layers MLA make contact with each other. Dummy cells may be formed at positions where the dummy word lines DWL_up and DWL_down and the memory layers MLA make contact with each other.

As illustrated in FIG. 2, each of the cell strings ST having a U-shaped structure may include the memory layer MLA at which a drain selection transistor is formed and the memory layer MLA at which a source selection transistor is formed. The drain selection transistor may be formed at a position where the memory layer MLA and the drain selection line DSL make contact with each other. The source selection transistor may be formed at a position where the memory layer MLA and the source selection line SSL make contact with each other. The cell strings ST may have various other structures in addition to the U-shaped structure. In the cell strings ST having the U-shaped structure, the drain selection transistor and the source selection transistor may be formed at top portions of the respective memory layers MLA.

Bit lines BLe and BLo may be coupled to the memory layers through plugs where the drain selection transistors are formed. The source line SL may be coupled to the memory layers through plugs where the source selection transistors are formed. The bit lines BLe and BLo may be divided into even bit lines BLe and odd bit lines BLo according to their arrangements.

Due to characteristics of manufacturing processes, each of the memory layers MLA may have a thickness varying with height. For example, thicknesses of devices formed in upper regions P_up of the memory layers MLA, may be greater than those of devices formed in lower regions P_down thereof.

The difference in thickness between the upper region P_up and the lower region P_down of the memory layer MLA is described below.

Figure 3:
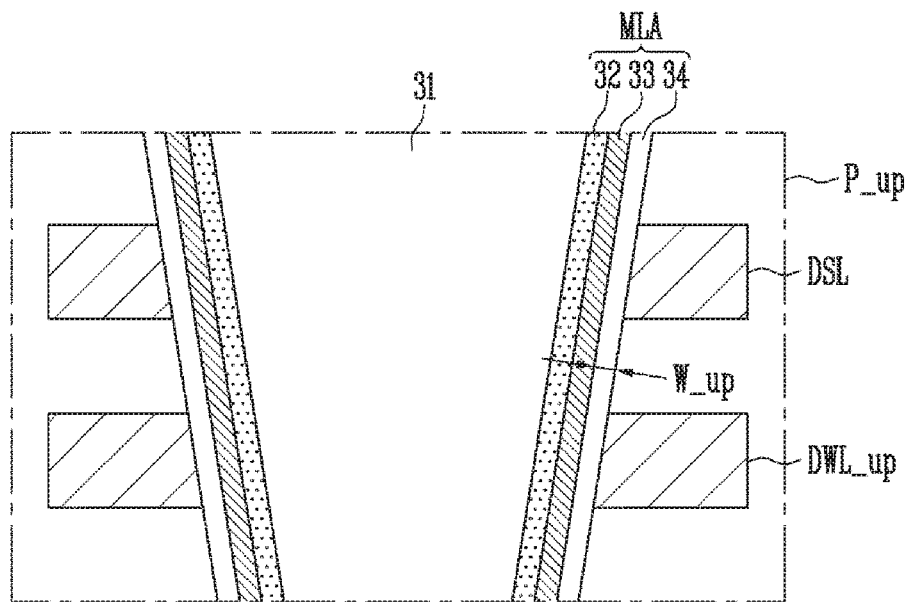
FIGS. 3 and 4 are cross-sectional diagrams illustrating an example of a representation of the structure of a memory layer.
Figure 4:
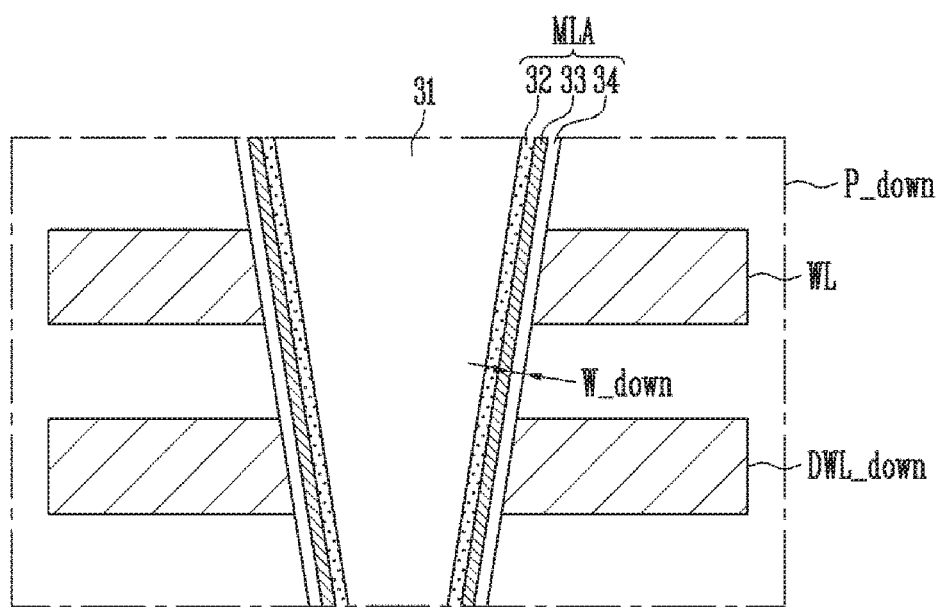

FIGS. 3 and 4 are cross-sectional diagrams illustrating an example of a representation of the structure of a memory layer. FIG. 3 is a cross-sectional diagram of the upper region P_up of the memory layer MLA (i.e., see FIG. 2). FIG. 4 is a cross-sectional diagram of the lower region P_down of the memory layer MLA (i.e., see FIG. 2).

Referring to FIGS. 3 and 4, the memory layer MLA may include a gate insulating layer 32, a charge storage layer 33 and a blocking layer 34. The gate insulating layer 32, charge storage layer 33 and blocking layer 34 may surround the vertical channel layer 31 having a columnar shape. A vertical insulating layer may be further formed at the center of the vertical channel layer 31. The gate insulating layer 32 may include an oxide layer, the charge storage layer 33 may include a nitride layer, and a blocking layer 34 may include an oxide layer. The gate insulating layer 32 may surround or substantially surround the vertical channel layer 31, the charge storage layer 33 may surround or substantially surround the gate insulating layer 32, and the blocking layer 34 may surround or substantially surround the charge storage layer 33.

Due to characteristics of manufacturing processes, a thickness of the blocking layer 34 formed between the charge storage layer 33 and gate lines (DSL and DWL_up) may decrease from the upper region P_up to the lower region P_down. For example, when a thickness of the blocking layer 34 around the top dummy word line DWL_up formed in the upper region Pup of the memory layer MLA is a first thickness W_up, a thickness of the blocking layer 34 around the bottom dummy word line DWL_down formed in the lower region P_down of the memory layer MLA may be a second thickness W_down smaller than the first thickness W_up.

In addition to the blocking layer 34, thicknesses of the tunnel insulating layer 32 and the charge storage layer 33 may decrease from the upper region P_up to the lower region P_down. When the difference in thickness occurs in the memory layer MLA, a difference in electric field may occur between the top or bottom dummy word lines DWL_up or DWL_down even when a voltage having the same level is applied thereto. As a result, top cells and bottom cells may have different electrical characteristics. In addition, even when the memory layer MLA has a uniform thickness from top to bottom, if a difference in width occurs in the vertical channel layer 31, the top cells and bottom cells may have different electrical characteristics.

Figures 5, 6:
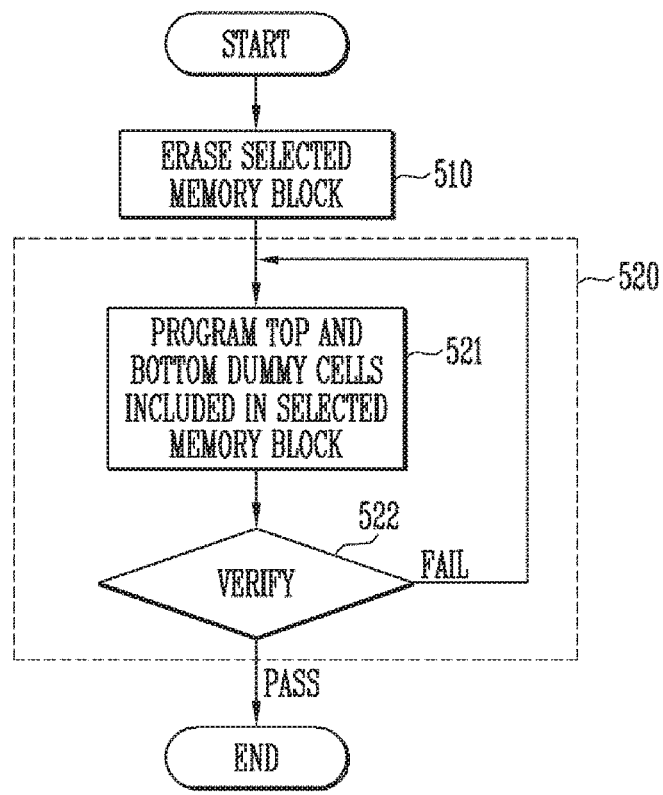
FIG. 5 is a flowchart illustrating an example of a representation of a soft program operation according to first embodiments.
FIG. 6 is a detailed view illustrating an example of a representation of voltages applied to respective lines during a soft program operation.

FIG. 5 is a flowchart illustrating an example of a representation of a soft program operation according to first embodiments.

Referring to FIG. 5, after an erase operation (510) is performed on a selected memory block, a soft program operation (520) may be formed on the selected memory block. The soft program operation (520) may be performed to reduce a width of threshold voltage distribution by increasing threshold voltages of dummy cells included in the erased memory block. The erase operation (510) and the soft program operation (520) will be described below.

The erase operation (510) may be performed by using an incremental step pulse erase (ISPE) method. In the ISPE method an erase voltage is gradually increased until threshold voltages of memory cells included in the selected memory block are reduced to less than an erase verify voltage.

When the erase operation (510) of the selected memory block is completed, the soft program operation (520) of the selected memory block may be performed. The soft program (soft program on chip; SOC) operation (520) may be performed by an incremental step pulse program (ISPP) method. In the ISPP method a soft program voltage is gradually increased. For example, the soft program operation (520) may include soft-programming dummy cells included in the selected memory block (521) and verifying the dummy cells (522). Soft-programming and verifying the dummy cells (521) and (522) may be performed on the top dummy cells formed in the upper region P_up illustrated in FIG. 3 of the memory layers MLA, illustrated in FIG. 3. Soft-programming and verifying the dummy cells (521) and (522) may be performed on the bottom dummy cells formed in the lower region P_down, illustrated in FIG. 4. The soft-programming and verifying of the dummy cells (521)

and (522) performed on the top dummy cells and bottom dummy cells may be performed at the same time or substantially the same time. For example, after soft programming (521) is performed on the top and bottom dummy cells at the same time, verification (522) may be performed on the top and bottom dummy cells at the same time. When the soft program verification (522) fails, soft programming (521) and soft program verification (522) may be repeated while the soft program voltage is gradually increased. The soft program operation (520) may be terminated when the soft program verification (522) passes.

As described above, to soft-program the top and bottom dummy cells at the same time, the soft program voltage and the soft program verify voltage applied to the top dummy word lines DWL_up, illustrated in FIG. 3, coupled to the top dummy cells and the bottom dummy word lines DWL_down, illustrated in FIG. 4, coupled to the bottom cells may be set to be different from each other. Voltages applied to respective lines during soft programming (521) and soft program verification (522) of the soft program operation (520) are described below.

FIG. 6 is a diagram illustrating an example of a representation of voltages applied to respective lines during a soft program operation.

Referring to FIG. 6, the soft program operation may include soft-programming (SOC program) the top and bottom dummy cells and verifying (SOC verify) the top and bottom dummy cells. SOC program and SOC verify are described below.

SOC Program

When the top and bottom dummy cells are soft-programmed (SOC program), the bit lines BL and the source selection line SSL may be coupled to a ground terminal (0V). When the top and bottom dummy cells are soft-programmed (SOC program) a power voltage Vdd may be applied to the source line SL and the drain selection line DSL. The word lines WL may be floated, be coupled to a ground terminal (0V), or receive a positive voltage. However, the positive voltage applied to the word lines WL may be set to a level that does not cause the memory cells coupled to the word lines to be programmed.

To program the bottom dummy cells, the first soft program voltage Vpgm_soc may be applied to the bottom dummy word line DWL_down. At the same time, a second soft program voltage Vpgm_soc+Va having a greater voltage (i.e., by a voltage Va) than the first soft program voltage Vpgm_soc applied to the bottom dummy word line DWL_down may be applied to the top dummy word line DWL_up to program the top dummy cells. In other words, since a thickness of a memory layer forming a top dummy cell is greater than that of a memory layer forming a bottom dummy cell, the top dummy cell and the bottom dummy cell may be soft-programmed at the same time by applying a higher soft program voltage to the top dummy word line DWL_up than to the bottom dummy word line DWL_down. When the soft program operation is performed by an incremental step pulse program (ISPP), the soft program voltage may be gradually increased. When the first soft program voltage Vpgm_soc applied to the bottom dummy word line DWL_down is increased by a step voltage, the second soft program voltage Vpgm_soc+Va applied to the top dummy word line DWL_down may be increased by the same step voltage.

TABLE 1

| | First soft program voltage | Second soft program voltage |
|---|---|---|
| $1^{st}$ | Vpgm_soc | Vpgm_soc + Va |
| $2^{nd}$ | Vpgm_soc + Vstep | Vpgm_soc + Va + Vstep |
| $3^{rd}$ | Vpgm_soc + 2Vstep | Vpgm_soc + Va + 2Vstep |
| ... | ... | ... |
| $n^{th}$ | Vpgm_soc + (n − 1) Vstep | Vpgm_soc + Va + (n − 1) Vstep |

Referring to Table 1, '$1^{st}$ to $n^{th}$' may refer to the number of times the soft program voltage is applied to the top and bottom dummy word lines DWL_up and DWL_down, and 'Vstep' may refer to a step voltage. In other words, the second soft program voltage is always set to be higher than the first soft program voltage by a voltage 'Va.' The voltage 'Va' may be set by performing a test operation on the semiconductor device.

The test operation may be performed as follows.

A first test voltage may be applied to the bottom dummy word line DWL_down, and a threshold voltage variation of the bottom dummy cell may be checked. Subsequently, by applying voltages with various levels to the top dummy word line DWL_up, a voltage allowing the threshold voltage variation of the top dummy cell to be the same as a threshold voltage variation of the bottom dummy cell, among these voltages, may be set to a second test voltage. A voltage difference between the second test voltage and the first test voltage may be set to the voltage 'Va.'

After the top and bottom dummy cells are soft-programmed, the top and bottom dummy cells may be verified as follows:

SOC Verify

When the top and bottom dummy cells are verified (SOC verify), the positive voltage may be applied to the bit lines BL, a ground terminal (0V) may be coupled to the source line SL, and a turn on voltage $V_{ON}$ may be applied to the drain selection line DSL and the source selection line SSL. The word lines WL may be floated, be coupled to a ground terminal (0V), or receive a positive voltage.

To verify the bottom dummy cell, the first soft program verify voltage Vf_soc may be applied to the bottom dummy word line DWL_down. At the same time, the second soft program verify voltage Vf_soc+Vb having a greater voltage (i.e., by a voltage Vb) than the first soft program verify voltage Vf_soc applied to the bottom dummy word line DWL_down may be applied to the top dummy word line DWL_up to verify the top dummy cell. In other words, since a thickness of the memory layer forming the top dummy cell is greater than that of the memory layer forming the bottom dummy cell, the top dummy cell and the bottom dummy cell may be verified at the same time by applying a higher soft program verify voltage to the top dummy word line DWL_up than to the bottom dummy word line DWL_down. When the first soft program verify voltage Vf_soc applied to the bottom dummy word line DWL_down is changed, the second soft program verify voltage Vf_soc+Vb applied to the top dummy word line DWL_down may also be changed by the same variation.

In substantially the same manner as the voltage 'Va,' a voltage 'Vb' may be set by performing a test operation on the semiconductor device.

In the earlier first embodiments, the soft program operation of the three-dimensional semiconductor device including the U-shaped cell strings is described. In the second embodiments, a soft program operation may be performed on a three-dimensional semiconductor device including I-shaped cell strings is described.

Figure 7:
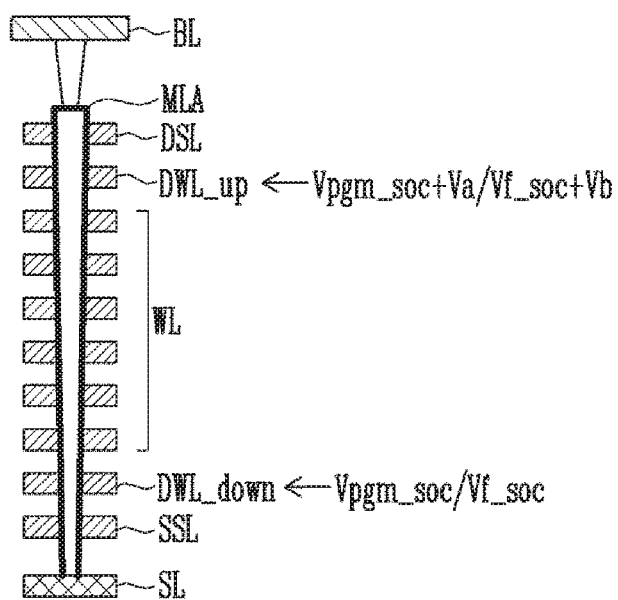
FIG. 7 is a diagram illustrating an example of a representation of a soft program operation according to second embodiments.

FIG. 7 is a diagram illustrating an example of a representation of a soft program operation according to second embodiments.

Referring to FIG. 7, in the I-shaped cell string, the source line SL may be formed at a lower portion thereof. The memory layer MLA may be formed in a vertical direction to a top portion of the source line SL. The bit lines BL may be coupled to a top portion of the memory layer MLA through a plug. The source selection line SSL may be coupled to the bottom of the memory layer MLA. The bottom dummy word line DWL_down, the word lines WL, the top dummy word line DWL_up and the drain selection line DSL may be sequentially stacked over the source selection line SSL and separated from each other. Memory cells may be formed at positions where the word lines WL and the memory layers MLA make contact with each other. Dummy cells may be formed at positions where the dummy word lines DWL_up and DWL_down and the memory layers MLA make contact with each other.

Due to characteristics of manufacturing processes, the memory layer MLA of the I-shaped cell string may have a thickness varying with height. For example, thicknesses of upper devices of the memory layer MLA may be greater than those of lower devices thereof. Therefore, during a soft program operation of the top and bottom dummy cells, when the first soft program voltage Vpgm_soc is applied to the bottom dummy word line DWL_down, the second soft program voltage Vpgm_soc+Va having a greater voltage (i.e., by a voltage Va) than the first soft program voltage Vpgm_soc may be applied to the top dummy word line DWL_up. In addition, during a soft program verify operation, when the first soft program verify voltage Vf_soc is applied to the bottom dummy word line DWL_down, the second soft program verify voltage Vf_soc+Vb having a greater voltage (i.e., by a voltage Vb) than the first soft program verify voltage Vf_soc may be applied to the top dummy word line DWL_up.

As described above, during the soft program operation of the dummy cells, by applying the higher soft program voltage Vpgm_soc or soft program verify voltage Vf_soc to the top dummy word line than to the bottom dummy word line DWL_down, the soft program operation may be performed on the top and bottom dummy cells at the same time. Therefore, a soft program operation time may be reduced, so that an operating speed of the semiconductor device may be improved.

Figure 8:
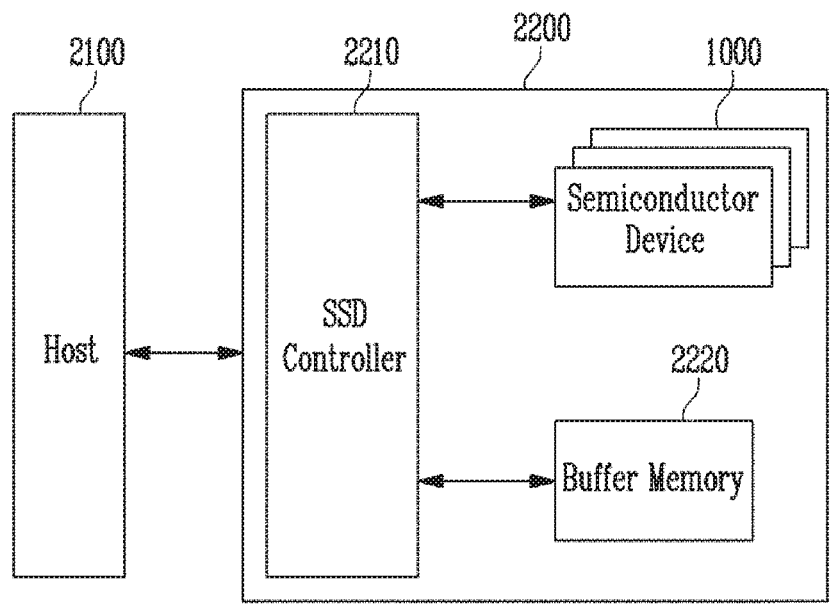
FIG. 8 is a block diagram illustrating an example of a representation of a solid state drive including a semiconductor device according to an embodiment.

FIG. 8 is a block diagram illustrating an example of a representation of a solid state drive including a semiconductor device according to the embodiments with regards to FIGS. 1-7.

Referring to FIG. 8, a drive device 2000 may include a host 2100 and an SSD 2200. The SSD 2200 may include an SSD controller 2210, a buffer memory 2220 and a semiconductor device 1000.

The SSD controller 2210 may provide a physical connection between the host 2100 and the SSD 2200. In other words, the SSD controller 2210 may perform interfacing with the SSD 2200 in response to a bus format of the host 2100. The SSD controller 2210 may decode a command provided from the host 2100. According to a decoding result, the SSD controller 2210 may access the semiconductor device 1000. As the bus format of the host 2100, Universal Serial Bus (USB), Small Computer System Interface (SCSI), Peripheral Component Interconnect Express (PCI-E), Advanced Technology Attachment (ATA), Parallel ATA (PATA), Serial ATA (SATA), and Serial Attached SCSI (SAS) may be included.

The buffer memory 2220 may temporarily store program data provided from the host 2100 or data read from the semiconductor device 1000. When a read request is made by the host 2100, if data in the semiconductor device 1000 is cached, the buffer memory 2220 may support a cache function to directly provide the cached data to the host 2100. In general, data transfer speed by the bus format (for example, SATA or SAS) of the host 2100 may be higher than the transfer speed of a memory channel of the SSD 2200. In other words, when an interface speed of the host 2100 is higher than the transfer speed of the memory channel of the SSD 2200, performance degradation caused by the speed difference may be minimized by providing a buffer memory 2220 having a large capacity. The buffer memory 2220 may be provided as Synchronous DRAM in order to provide sufficient buffering in the SSD 2200.

The semiconductor device 1000 may be provided as a storage medium of the SSD 2200. For example, the semiconductor device 1000 may be provided as a nonvolatile memory device having large storage capacity as described above with reference to FIG. 1. The semiconductor device 1000 may be a NAND-type flash memory.

Figure 9:
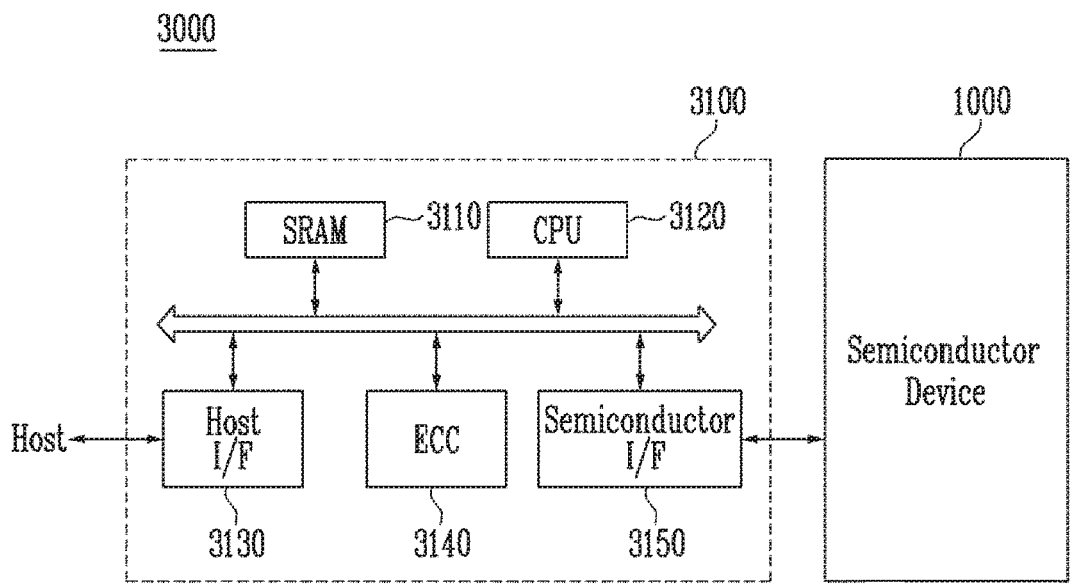
FIG. 9 is a block diagram illustrating an example of a representation of a memory system including a semiconductor device.

FIG. 9 is a block diagram illustrating an example of a representation of a memory system including a semiconductor device according to the embodiments with regards to FIGS. 1-8.

Referring to FIG. 9, a memory system 3000 according to an embodiment may include a memory control unit 3100 and the semiconductor device 1000.

Since the semiconductor device 1000 may have substantially the same configuration as illustrated in FIG. 1, a detailed description thereof may be omitted.

The memory control unit 3100 may be configured to control the semiconductor device 1000. An SRAM 3110 may be used as a working memory of a CPU 3120. A host interface (I/F) 3130 may include a data exchange protocol of a host electrically coupled with the memory system 3000. An error correction circuit (ECC) 3140 in the memory control unit 3100 may detect and correct an error in data read from the semiconductor device 1000. A semiconductor I/F 3150 may interface with the semiconductor device 1000. The CPU 3120 may perform a control operation for data exchange of the memory control unit 3100. In addition, although not illustrated in FIG. 10, a ROM (not illustrated) for storing code data for interfacing with a host may be provided in the memory system 3000.

In an embodiment, the memory system 3000 may be applied to one of a computer, an Ultra Mobile PC (UMPC), a workstation, a net-book, a PDA, a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, and various devices constituting a home network.

Figure 10:
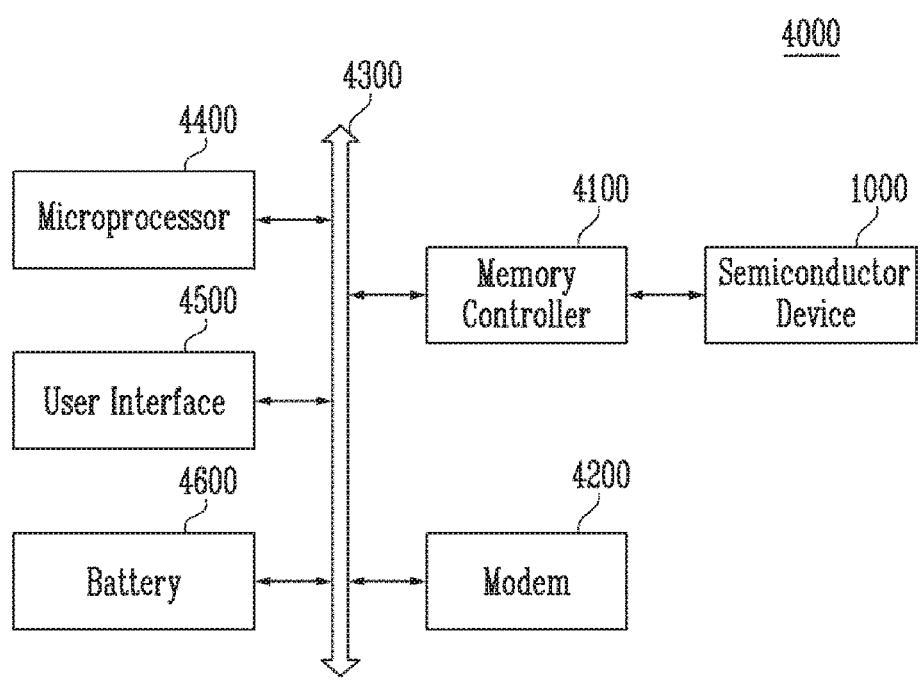
FIG. 10 is a schematic diagram illustrating an example of a representation of a computing system including a semiconductor device according to an embodiment.

FIG. 10 is a schematic block diagram illustrating an example of a representation of a computing system 400 including a semiconductor device according to the embodiments with regards to FIGS. 1-9.

Referring to FIG. 10, the computing system 4000 includes an embodiment of a semiconductor device 1000 electrically coupled to a bus 4300, a memory controller 4100, a modem 4200, a microprocessor 4400, and a user interface 4500. When the computing system 4000 is a mobile device, a battery 4600 for supplying an operation voltage of the computing system 4000 may be additionally provided. The computing system 4000 may include an application chip set (not shown), a camera image processor (CIS) (not shown), a mobile DRAM (not shown), and the like.

The semiconductor device 1000 may be configured in substantially the same manner as the semiconductor device 1000 illustrated in FIG. 1. Thus, a detailed description thereof will be omitted.

The memory controller 4100 and the semiconductor device 1000 may be components of a Solid State Drive/Disk (SSD).

The semiconductor device 1000 and the memory controller 4100 may be mounted using various types of packages. For example, the semiconductor device 1000 and the memory controller 4100 may be mounted using packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-level Processed Stack Package (WSP), and the like.

According to the various embodiments, since a soft program operation time of a three-dimensional semiconductor device may be reduced, the operation time of a semiconductor device and a system including the same may be improved.

What is claimed is:

1. An operating method of a semiconductor device, the operating method comprising performing a soft program operation on a first dummy cell adjacent to a bit line and a second dummy cell adjacent to a source line by applying a first soft program voltage to a first dummy word line coupled to the first dummy cell and a second soft program voltage less than the first soft program voltage to a second dummy word line coupled to the second dummy cell,
   wherein the first dummy cell is over the second dummy cell, and a width a plug of the first dummy cell is greater than a width of the plug of the second dummy cell.

2. The operating method of claim 1, wherein when the first soft program voltage is increased by a first step voltage, the second soft program voltage is increased by a second step voltage.

3. The operating method of claim 1, wherein at least one of the first and second soft program voltages is set by performing a test operation.

4. The operating method of claim 3, wherein the test operation comprises:
   applying a first test voltage to the first dummy word line;
   checking a threshold voltage variation of the first dummy cell;
   applying voltages having various levels to the second dummy word line;
   setting a voltage allowing a threshold voltage variation of the second dummy cell to be the same as the threshold voltage variation of the first dummy cell as a second test voltage; and
   setting a voltage increased from the first soft program voltage by a voltage difference between the first test voltage and the second test voltage as the second soft program voltage.

5. The operating method of claim 1, further comprising verifying the first dummy cell and the second dummy cell after applying the first soft program voltage to the first dummy word line.

6. The operating method of claim 5, wherein the verifying of the first and second dummy cells comprises applying a first soft program verify voltage to the first dummy word line and a second soft program verify voltage less than the first soft program verify voltage to the second dummy word line.

7. The operating method of claim 1, further comprising erasing the first and second dummy cells and memory cells stacked between the first and second dummy cells before the performing of the soft program operation.

8. The operating method of claim 1, wherein each of the first and second dummy cells includes a vertical channel layer and a memory layer surrounding the plug.

9. An operating method of a semiconductor device including a cell string coupled between a bit line and a source line and having memory cells stacked on top of one another, the operating method comprising:
   performing a soft program operation on a first dummy cell and a second dummy cell which are included in the cell string by applying a first soft program voltage to a first dummy word line coupled to the first dummy cell and a second soft program voltage less than the first soft program voltage to a second dummy word line coupled to the second dummy cell,
   wherein the first dummy cell is closer to the bit line than the source line, and the second dummy cell is closer to the source line than the bit line,
   wherein the first dummy cell is over the second dummy cell, and a width a plug of the first dummy cell is greater than a width of the plug of the second dummy cell.

10. The operating method of claim 9, wherein the first soft program voltage is set to be greater as the first dummy cell is closer to the bit line, and the second soft program voltage is set to be lower voltage as the second dummy cell is closer to the source line.

11. The operating method of claim 9, wherein the first and second dummy cells have different electrical characteristics.

12. The operating method of claim 9, wherein each of the first and second dummy cells includes a vertical channel layer and a memory layer surrounding the plug.

* * * * *